United States Patent [19]

Ecer et al.

[11] Patent Number: 4,486,247

[45] Date of Patent: Dec. 4, 1984

[54] WEAR RESISTANT STEEL ARTICLES WITH CARBON, OXYGEN AND NITROGEN IMPLANTED IN THE SURFACE THEREOF

[75] Inventors: Gunes M. Ecer, Irvine, Calif.; Susan Wood, Pittsburgh; Jan J. Schreurs, Plum Boro, both of Pa.

[73] Assignee: Westinghouse Electric Corp., Pittsburgh, Pa.

[21] Appl. No.: 390,716

[22] Filed: Jun. 21, 1982

[51] Int. Cl.³ .............................................. C23C 15/00
[52] U.S. Cl. .................................... 148/31.5; 148/39; 204/192 N; 427/38
[58] Field of Search .................. 148/4, 31.5, 16.6, 39, 148/6.35, 15.5; 204/192 N; 427/38

[56] References Cited

U.S. PATENT DOCUMENTS

| | | |
|---|---|---|
| 3,682,729 | 8/1972 | Gukelberger, Jr. et al. ... 204/192 N |
| 3,806,380 | 4/1974 | Kitada et al. .................... 204/192 N |
| 3,832,219 | 8/1974 | Nelson et al. .................... 204/192 N |
| 3,900,636 | 8/1975 | Curry et al. ..................... 204/192 N |
| 3,915,757 | 10/1975 | Engel ............................... 204/192 N |
| 3,925,116 | 12/1975 | Engel ..................................... 148/39 |
| 4,105,443 | 8/1978 | Dearnaley et al. ....................... 148/4 |

FOREIGN PATENT DOCUMENTS 2058146 4/1981 United Kingdom ........... 204/192 N

OTHER PUBLICATIONS

Dearnaley et al., "Ion Implantatioin into Metals and Carbides", Thin Solid Films, 54(1978), pp. 215-232.

Dearnaley, "The Ion Implantation of Metals and Engineering Materials", Transactions of the Institute of Metal Finishing, 1978, vol 56, pp. 25-31.

Krauss, "Principles of Heat Treatment of Steel", American Society for Metals, 1980, pp. 269-271.

Primary Examiner—L. Dewayne Rutledge
Assistant Examiner—Robert L. McDowell
Attorney, Agent, or Firm—John J. Prizzi

[57] ABSTRACT

The present invention pertains to steel articles having improved wear and friction properties and the method of producing these articles. A steel surface containing relatively high levels of nitrogen and having a surface film containing carbon is implanted with high energy ions. Overlapping layers enriched in carbon and nitrogen are formed beneath the surface and provide the steel with a surface that has improved wear and friction characteristics.

10 Claims, 5 Drawing Figures

WEAR RESISTANT STEEL ARTICLES WITH CARBON, OXYGEN AND NITROGEN IMPLANTED IN THE SURFACE THEREOF

BACKGROUND OF THE INVENTION

The present invention relates to steels having high wear resistance and low friction surfaces and methods of producing these surfaces on steel.

In the past, the wear resistance of steel surfaces has been improved by subjecting the steel to a high temperature process in which a wear resistant coating is bonded to the surface or an element such as, carbon and/or nitrogen, is thermally diffused into the steel surface to locally increase the hardness of the steel itself in a relatively wide layer extending inwardly from the steel surface.

More recently, the use of ion implantation as a means for improving the wear resistance of steels and other alloys has begun to be explored. Ion implantation involves the implantation of a high energy, typically 10–400 keV, ionized species of atom or molecule into the surface being treated. The implanted ions are distributed in a relative thin band in a gaussian-like manner beneath the treated surface and produce a layer of irradiation hardened material in their wake. Thermal diffusion of the implanted species is insignificant since the process is carried out at a low temperature. Examples of ion implantation in steels are described in U.S. Pat. Nos. 3,900,636 and 3,832,219.

While improvements have been made in the wear and frictional properties of steel surfaces by the above processes, there still exists a need to provide further enhancement and optimization of these properties.

BRIEF SUMMARY OF THE INVENTION

In accordance with the present invention a steel member is provided having a low friction, high wear resistance surface layer formed by a process, also in accordance with this invention, which includes the steps of:

(1) diffusing nitrogen into the surface by thermal means;

(2) forming a carbon containing film on the nitrided steel surface;

(3) bombarding the carbon film and the steel surface with high energy ions thereby implanting the carbon into the steel surface.

The steel body produced by this process has a surface having overlapping layers beneath it including a layer enriched in nitrogen and a layer enriched in carbon. These layers overlap in a zone about 300 to 2500 angstroms wide.

Optionally in accordance with the present invention, a layer enriched in oxygen may also be provided by forming a thin oxide film on the surface of the steel and then subsequently implanting at least a portion of the oxygen in the film into the steel surface by bombarding it with high energy ions. The steel body produced by this embodiment of the invention has a zone beneath its surface enriched in oxygen, carbon and nitrogen to a depth of about 300 to 1000 angstroms below the steel surface.

These and other aspects of the present invention will become more apparent upon review of the following description of the invention in conjunction with the figures briefly described below.

DETAILED DESCRIPTION OF THE INVENTION

Figure 1:
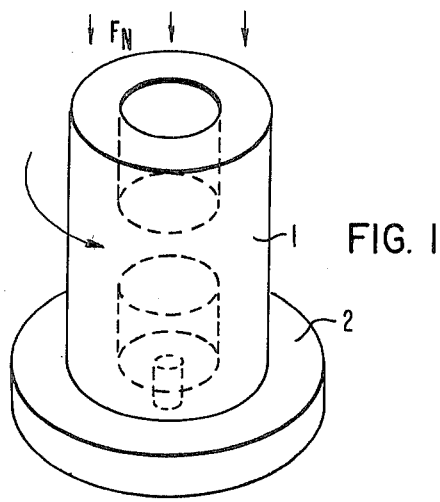
FIG. 1 shows a wear and friction test couple used to test the present invention.

In accordance with the present invention, a process for improving the wear resistance of conventionally nitrided steels has been discovered. The material treated in accordance with this invention has improved wear resistance compared to steels which have been only thermally nitrided or only nitrided by ion implantation.

The process according to this invention provides for the production of a relatively thick nitrided layer extending inwardly from one or more surfaces of a steel component. Typically, this layer is at least approximately 10 to 160 microns thick, and preferably about 20 to 40 microns thick. The maximum nitrogen concentration in this layer may be controlled between about 600 and 15,000 ppm. Any of the conventional thermal diffusion techniques, known to those skilled in the art, may be used to produce this nitrided layer. These techniques include both liquid and gas nitriding.

After the forming of the thermal diffusion nitride layer, a thin layer of carbon is implanted into the nitrided surface. Preferably, the carbon is implanted by bombarding a thin surface film containing carbon with a high energy ion specie so that a thin zone enriched in both carbon and nitrogen is formed beneath the steel surface. The layer containing carbon may be applied to the surface to be treated either during thermal nitriding (e.g. by carbonitriding techniques), in a separate step after thermal nitriding, during ion implantation itself, or by a combination of these techniques. A film of the elemental carbon may be applied to the surface during the ion implantation step by controlling the level of the vacuum in the target chamber containing the component to be implanted. It has been found that when the vacuum is maintained between about $10^{-4}$ to $10^{-3}$ Pa a layer of elemental carbon is placed on the surface due to the cracking of vacuum diffusion pump oil. A portion of this carbon is implanted into the surface of the steel. Preferably, nitrogen ions having an energy of 20 to 200 KeV and most preferably 50 to 150 KeV, are utilized to implant the carbon. The nitrogen ion fluence is preferably about $0.5 \times 10^{17}$ to $2 \times 10^{17}$ nitrogen ions/cm$^2$.

In addition to the above, an optional layer of oxygen may be implanted in the steel surface in much the same manner as the carbon was implanted, that is by recoil implantation. However, it is preferred that the oxide layer first be formed on the surface of the steel during thermal nitriding or during cooling from the thermal nitriding temperature. In this manner, a wear resistant steel surface is formed having a zone extending inwardly from it, of about 300 to 1000 angstroms wide which is enriched in carbon, oxygen and nitrogen.

The products produced by this process are characterized by significantly improved lubricated sliding wear resistance under pressures exceeding 300 to 400 psi. These products have an enriched zone beneath the surface containing carbon, nitrogen preferably up to about 15 atomic percent, optionally oxygen, and including iron and other elements contained in steel body.

A number of friction and wear test specimens were machined from 17-4 PH stainless steel (a registered trademark of ARMCO Steel Corp.) base stock. The specimen configurations, a cylinder 1 and disc 2 are shown in FIG. 1. The cylinder 1 had an outside diameter of ½ inch and an inside diameter of ¼ inch. The disc had an outside diameter of slightly less than ¾ inch and a −3/32 diameter centrally located axial hole. Some of the specimens were gas nitrided as follows:

1. one hour at 524° C. in dissociated ammonia;
2. ten hours at 524° C. in 30% dissociated ammonia; and
3. cooled in dissociated ammonia to below 150° C.

Each step of the above treatment was performed at atmospheric pressure. This treatment yields a calculated nitrided depth of approximately 25 microns. A thin surface film containing oxygen and carbon was also produced during this treatment.

Some of the specimens in the untreated condition and some of the specimens in the nitrided condition were then ion implanted under the following conditions:

| | |
|---|---|
| Fluence, $N^+/cm^2$ | $1 \times 10^{17}$ |
| Ion | $N^+$ |
| Beam Current, $\mu A$ | 500 |
| Current Density, $\mu A/cm^2$ | 5.5 |
| Beam Voltage, KeV | 100 |
| Beam Coverage, $cm^2$ (rastered) | 91 |
| Implantation Time, sec. | 2919 |
| Target Chamber Pressure, Pa (pascals) | $7\text{-}8 \times 10^{-4}$ |
| Estimated Maximum Specimen Temperature, °C. | $<50$ |

As indicated by the following examples, machines having components, each having surfaces treated in accordance with this invention, and which are in sliding, lubricated contact with each other under a load, should offer distinct advantages from a wear and friction standpoint.

Sliding friction and wear tests were conducted on untreated, thermally nitrided, N+ implanted and nitrided plus N+ implanted disc and cylinder couples (i.e. having the same treatment history). The stationary disc 2, shown in FIG. 1, was fixed in a spring floated solid copper base cylinder (not shown). A chuck arrangement (not shown) allowed the rotating cylinder specimen 1 to be pressed down against the stationary disc specimen (race) 2 under a load ($F_N$) which could be varied at will. A transducer (not shown) attached to the copper base measured frictional force ($F_F$) which was continually recorded.

All tests were run under lubricated conditions using Chevron BRB-2-SRI, a standard petroleum lubricant containing a polyurea thickener and additives for improved oxidation stability and anti-wear characteristics. Each specimen couple was lubricated once, at the beginning of the test, which usually ran for 30 minutes. All tests were run by rotating the cylinder-shaped specimen at a speed of 1000 rpm. The wear specimens were ultrasonically cleaned in acetone, before and after the tests, and weight changes recorded.

In addition to measuring the wear damage by weight change, the specimens were examined by surface profilometer.

Figure 2:
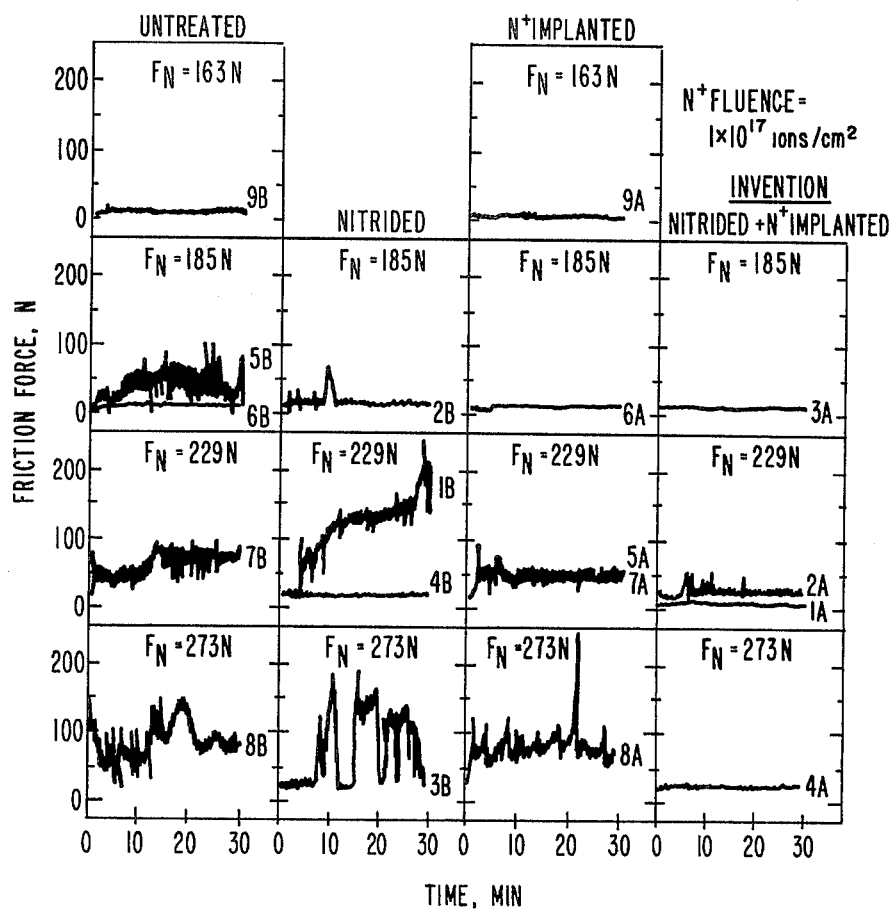
FIG. 2 demonstrates improvements in frictional force obtained by a surface treatment in accordance with the present invention.

The wear and friction test results have indicated that these properties in the thermally nitrided and implanted material are superior to those found in the other conditions of the material. FIG. 2 presents the frictional force variations between similarly treated specimen couples as a function of time and load, $F_N$. Each column represents one surface condition and each row represents a different load. Two couples were utilized for some conditions (e.g., nitrided with $F_N=229$ N (newtons)). In general, the nitrided and N+ implanted condition shows a reduction in the friction force compared to the untreated surface. Erratic variations in the frictional force are also largely absent for the nitrided and implanted condition, and improvements over the other surface conditions are most pronounced at the higher loads.

Figure 3:
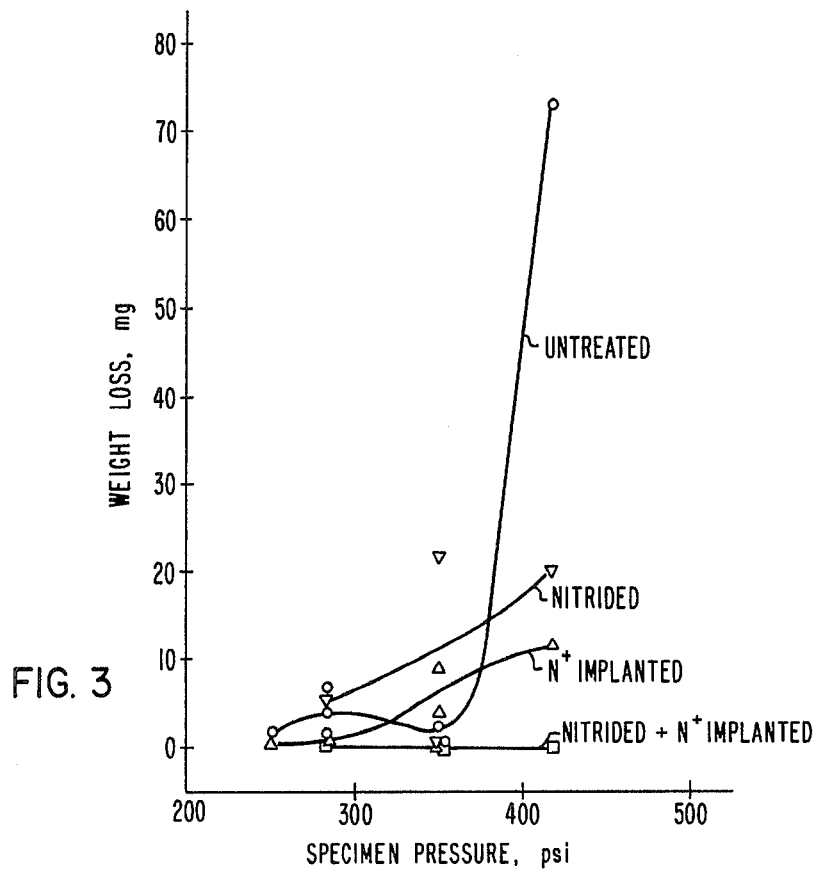
FIGS. 3 and 4 demonstrate the improved wear resistance of a surface treatment in accordance with the present invention as measured by weight loss.
Figure 4:
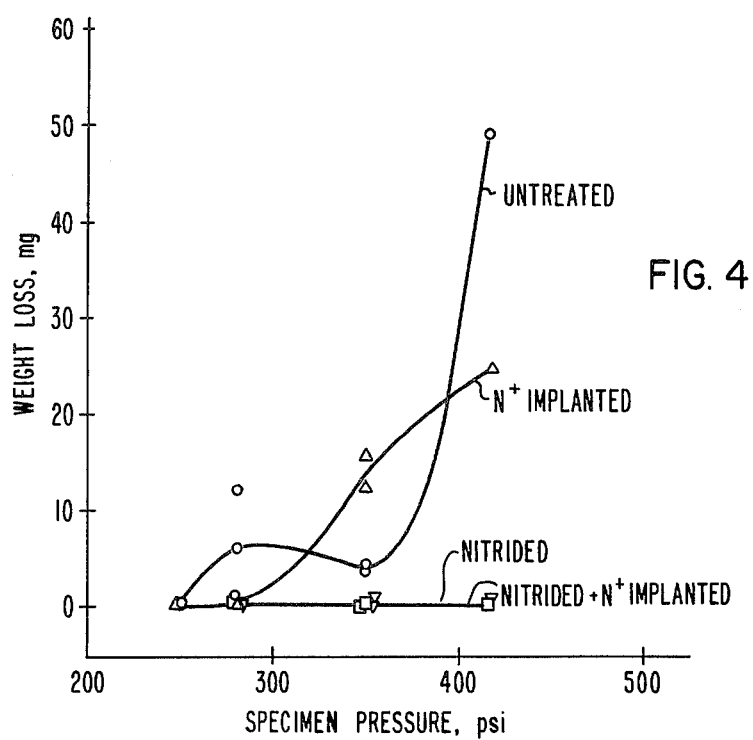
Figure 5:
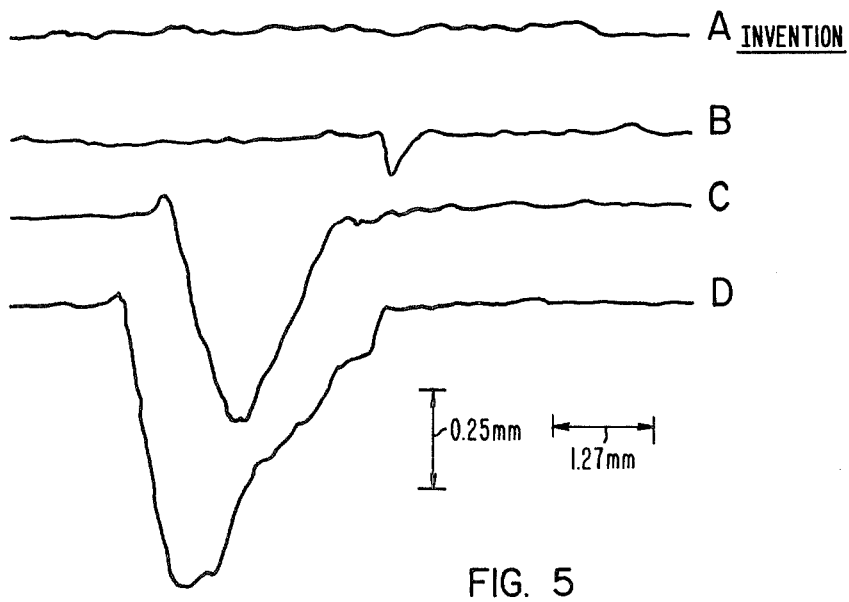
FIGS. 5A–D demonstrates the improved wear resistance of a surface treatment in accordance with the present invention as measured by surface profilometry after wear testing.

FIGS. 3 and 4 show the weight loss in milligrams as a function of pressure after 30 minutes of testing for the rotating cylinder and stationary disc, respectively. Overall, the specimen couples having a nitrided and ion implanted surface had superior wear resistance in comparison with any of the other surface treatments. This conclusion finds further support in the profilometer traces of the wear tracks produced in the stationary disc specimens tested at 416 psi. Typical traces are shown in FIG. 5 where (A) is the nitrided plus ion implanted surface, (B) is the thermally nitrided surface, (C) is the ion implanted surface, and (D) is the untreated surface.

The oxygen, nitrogen and carbon contents of the near surface regions of the 17-4 PH stainless steel specimens were semiquantitatively determined by Auger Electron Spectroscopy (AES) in conjunction with sputtering. Surfaces with each of the four treatment histories were analyzed. An argon ion beam was used to mill the surface at a rate of about 8 nanometers per minute. Spectra were taken at various depths. It was found that the nitrogen implantation did not produce a significant effect on the nitrogen concentration but did serve to recoil implant at least a portion of the oxygen and carbon atoms existing as a surface film about 300 to 500 angstroms wide on the thermally nitrided surface. The maximum nitrogen concentration beneath the surface did not significantly differ between the ion implanted, thermally nitrided and thermally nitrided plus ion implanted specimens, and was about 10 to 15 atomic percent. With respect to the carbon and oxygen contents, layers enriched significantly above the near surface carbon and oxygen concentrations produced by the other treatments were found in the nitrided and ion implanted material. These layers of enriched carbon and oxygen extended from the steel surface to depths of about 2500 angstroms and about 500 angstroms, respectively. The layer of nitrogen enrichment extended to depths significantly beyond those of the oxygen and carbon enriched layers. Analysis of the materials which were only thermally nitrided or nitrogen ion implanted showed no subsurface layers of significant thickness having a significant enrichment in oxygen or carbon. The thermally nitrided only material had an oxide and carbon containing film on its surface. The concentration of carbon in this carbon and oxygen containing film was approximately twice that found in the steel substrate. The ion implanted only material and the thermally nitrided and ion implanted material had a film of carbon on their implanted surfaces.

While the present invention has been described with respect to steel in general, and more particularly, with respect to stainless steel alloy 17-4 PH, it should be understood that this invention is also applicable to the other grades of stainless steel, including those which are of the precipitation hardening type. These embodiments are intended to be illustrative and are not intended as limitations on the scope of the coverage provided by the following claims.

We claim:

1. A steel member having a low friction, high wear resistance surface layer formed by the process comprising the steps of:
    diffusing nitrogen into said surface by thermal means;
    forming an oxygen containing film;
    forming a carbon containing film on said surface;
    then implanting nitrogen into said surface using accelerating beam voltages between about 10 and 400 KeV in a vacuum of about $10^{-4}$ to $10^{-3}$ Pa until a fluence of about $0.5 \times 10^{17}$ to $2 \times 10^{17}$ nitrogen ions/cm$^2$ is achieved; and wherein said implanting of nitrogen results in implanting carbon and oxygen into said surface from said carbon containing film and said oxygen containing film.

2. The steel member in accordance with claim 1 or 2 wherein an accelerating beam voltage of 50 to 150 KeV is used to implant said nitrogen ions.

3. The steel member according to claim 1 wherein said steel member is a stainless steel alloy.

4. The steel member according to claim 3 wherein said stainless steel alloy is a precipitation hardening alloy.

5. The steel member in accordance with claim 1 wherein said alloy is a type 17-4 PH stainless steel.

6. An article of manufacture comprising:
    a steel body;
    said steel body having a low friction, high wear resistance surface;
    overlapping layers beneath said surface, including a layer enriched in nitrogen and a layer enriched in carbon, and wherein said layer enriched in nitrogen and said layer enriched in carbon overlap in a zone about 300 to 2500 angstroms wide;
    and a layer enriched in oxygen overlapping said layer enriched in nitrogen and said layer enriched in carbon.

7. The article of manufacture in accordance with claim 6 wherein said zone contains oxygen, carbon, about 600 to 15,000 ppm nitrogen, and the balance consisting of iron and other elements present in said steel body.

8. The article according to claim 7 wherein said steel body is a stainless steel.

9. The article according to claim 8 wherein said stainless steel is a precipitation hardening type.

10. The article according to claim 9 wherein said stainless steel is a type 17-4 PH stainless steel.

* * * * *